United States Patent
Park et al.

(10) Patent No.: US 11,257,718 B2
(45) Date of Patent: Feb. 22, 2022

(54) CONTACT STRUCTURES

(71) Applicant: GLOBALFOUNDRIES U.S. INC., Santa Clara, CA (US)

(72) Inventors: Chanro Park, Clifton Park, NY (US); Stan Tsai, Ballston Lake, NY (US)

(73) Assignee: GLOBALFOUNDRIES U.S. INC., Malta, NY (US)

( * ) Notice: Subject to any disclaimer, the term of this patent is extended or adjusted under 35 U.S.C. 154(b) by 223 days.

(21) Appl. No.: 16/780,046

(22) Filed: Feb. 3, 2020

(65) Prior Publication Data
US 2020/0176325 A1    Jun. 4, 2020

Related U.S. Application Data

(62) Division of application No. 15/914,547, filed on Mar. 7, 2018, now Pat. No. 10,593,599.

(51) Int. Cl.
| | |
|---|---|
| *H01L 21/8234* | (2006.01) |
| *H01L 21/768* | (2006.01) |
| *H01L 21/311* | (2006.01) |
| *H01L 21/321* | (2006.01) |
| *H01L 27/088* | (2006.01) |
| *H01L 29/45* | (2006.01) |
| *H01L 29/06* | (2006.01) |
| *H01L 21/285* | (2006.01) |
| *H01L 29/08* | (2006.01) |
| *H01L 29/417* | (2006.01) |
| *H01L 29/66* | (2006.01) |

(52) U.S. Cl.
CPC ......... *H01L 21/823475* (2013.01); *H01L 21/31116* (2013.01); *H01L 21/3212* (2013.01); *H01L 21/7684* (2013.01); *H01L 21/76802* (2013.01); *H01L 21/76877* (2013.01); *H01L 21/76897* (2013.01); *H01L 27/088* (2013.01); *H01L 29/0649* (2013.01); *H01L 29/45* (2013.01); *H01L 21/28556* (2013.01); *H01L 21/28568* (2013.01); *H01L 21/76843* (2013.01); *H01L 29/0847* (2013.01); *H01L 29/41783* (2013.01); *H01L 29/665* (2013.01)

(58) Field of Classification Search
CPC combination set(s) only.
See application file for complete search history.

(56) References Cited

U.S. PATENT DOCUMENTS

| 6,680,540 B2 | 1/2004 | Nakano et al. |
| 6,743,683 B2 | 6/2004 | Barns et al. |

(Continued)

OTHER PUBLICATIONS

Taiwanese Office Action in related US Application No. 108104074 dated Aug. 29, 2019, 5 pages.

*Primary Examiner* — Mark W Tornow
*Assistant Examiner* — Priya M Rampersaud
(74) *Attorney, Agent, or Firm* — Francois Pagette; Andrew M. Calderon; Roberts Calderon Safran & Cole, P.C.

(57) ABSTRACT

The present disclosure relates to semiconductor structures and, more particularly, to contact structures and methods of manufacture. The method includes: recessing an isolation region between adjacent gate structures and below metallization overburden of source/drain metallization; planarizing the metallization overburden to a level of the adjacent gate structures; and forming source/drain contacts to the source/drain metallization, on sides of and extending above the adjacent gate structures.

14 Claims, 3 Drawing Sheets

(56) References Cited

U.S. PATENT DOCUMENTS

| | | | |
|---|---|---|---|
| 9,412,616 B1* | 8/2016 | Xie | H01L 27/1211 |
| 9,564,369 B1* | 2/2017 | Kim | H01L 29/6656 |
| 10,128,240 B2* | 11/2018 | Min | H01L 21/823468 |
| 2002/0081794 A1 | 6/2002 | Ito | |
| 2008/0076688 A1 | 3/2008 | Barnes et al. | |
| 2009/0280649 A1 | 11/2009 | Mayer et al. | |
| 2012/0080681 A1 | 4/2012 | Kim et al. | |
| 2012/0261727 A1 | 10/2012 | Zhong et al. | |
| 2014/0361352 A1 | 12/2014 | Hung et al. | |
| 2015/0021688 A1 | 1/2015 | Sung et al. | |
| 2015/0364378 A1 | 12/2015 | Xie et al. | |
| 2016/0190130 A1* | 6/2016 | Yu | H01L 21/823431 |
| | | | 257/401 |
| 2016/0268392 A1* | 9/2016 | Zhu | H01L 29/0649 |
| 2018/0033699 A1* | 2/2018 | Zhu | H01L 21/76232 |
| 2018/0286956 A1 | 10/2018 | Xie et al. | |
| 2019/0096761 A1 | 3/2019 | Nieh et al. | |
| 2019/0164841 A1* | 5/2019 | St. Amour | H01L 21/28568 |
| 2020/0043929 A1* | 2/2020 | Hwang | H01L 21/823481 |

\* cited by examiner

US 11,257,718 B2

CONTACT STRUCTURES

FIELD OF THE INVENTION

The present disclosure relates to semiconductor structures and, more particularly, to contact structures and methods of manufacture.

BACKGROUND

Middle of line (MOL) processes are one key determinant of device yield. The MOL processes include, for example, cobalt metallization and source/drain contact formation.

The cobalt metallization and source/drain contact formation processes, though, pose several challenges as technologies scale downwards. For example, cobalt metallization poses a significant challenge due to difficulties in controlling polishing processes, e.g., chemical mechanical polishing (CMP). Specifically, CMP processes for cobalt material are not highly selective, which results in poor process control. This poor process control, in turn, causes local thinning (e.g., lack of uniformity) of a sacrificial cap material that protects the gate material. The poor process control can also result in punch through of the sacrificial capping material, landing on the gate material. This will expose the gate material resulting in a shorting to subsequently formed source/drain contacts.

SUMMARY

In an aspect of the disclosure, a method comprises: recessing an isolation region between adjacent gate structures and below metallization overburden of source/drain metallization; planarizing the metallization overburden to a level of the adjacent gate structures; and forming source/drain contacts to the source/drain metallization, on sides of and extending above the adjacent gate structures.

In an aspect of the disclosure, a method comprises: removing dielectric material that is above a surface of gate structures and within cobalt overburden of source/drain metallization features; planarizing the cobalt overburden to a capping material of the gate structures, after the removing of the dielectric material; depositing interlevel dielectric material on the capping material and the source/drain metallization features; and forming source/drain contacts to the source/drain metallization features within the interlevel dielectric material, on sides of an extending above the gate structures.

In an aspect of the disclosure, a structure comprises: a plurality of gate structures each of which include a capping material; source and drain regions adjacent to the plurality of gate structures; cobalt contacts between the plurality of gate structures and extending to and in electrical contact with the source and drain regions; an isolation material between adjacent gate structures of the plurality of gate structures; a stepped feature in the capping material of the adjacent gate structures; dielectric material in the stepped feature and above the capping material of the plurality of gate structures; and source and drain contacts in the dielectric material and contacting the cobalt contacts.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to contact structures and methods of manufacture. More specifically, the present disclosure provides a method to remove interlevel dielectric material selectively to Co and subsequently remove the Co overburden by a chemical mechanical polishing (CMP). Advantageously, the method to remove the Co overburden will result in minimal cap erosion.

The contact structures of the present disclosure can be manufactured in a number of ways using a number of different tools. In general, though, the methodologies and tools are used to form structures with dimensions in the micrometer and nanometer scale. The methodologies, i.e., technologies, employed to manufacture the contact structures of the present disclosure have been adopted from integrated circuit (IC) technology. For example, the structures are built on wafers and are realized in films of material patterned by photolithographic processes on the top of a wafer. In particular, the fabrication of the contact structures uses three basic building blocks: (i) deposition of thin films of material on a substrate, (ii) applying a patterned mask on top of the films by photolithographic imaging, and (iii) etching the films selectively to the mask.

Figure 1:
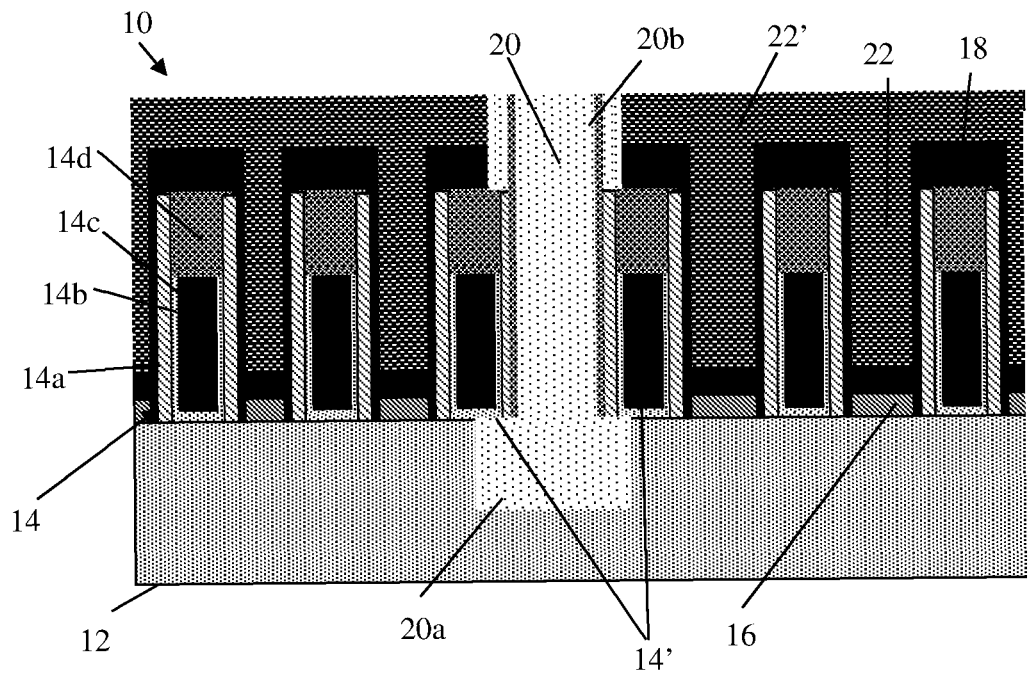
FIG. 1 shows an incoming structure with gate structures, amongst other features, and respective fabrication processes in accordance with aspects of the present disclosure.

FIG. 1 shows an incoming structure with gate structures, amongst other features, in accordance with aspects of the present disclosure. More specifically, the incoming structure 10 includes a plurality of gate structures 14 formed on an underlying substrate 12. In embodiments, the substrate 12 can be any suitable semiconductor material including, but not limited to, Si, SiGe, SiGeC, SiC, GaAs, InAs, InP, and other III/V or II/VI compound semiconductors. The substrate 12 can be representative of planar structure or a fin structure formed by conventional sidewall imaging techniques (SIT) such that no further explanation is required herein for an understanding of the present disclosure. Also, the substrate 12 can be representative of a bulk material, e.g., Si, or semiconductor on insulator (SOI) technologies, for either planar or finFET technologies. In addition, the plurality of gate structures 14 can be formed by conventional replacement gate processes such that no further explanation is required herein for an understanding of the present disclosure.

Still referring to FIG. 1, the plurality of gate structures 14 can include sidewall spacers 14a composed of, e.g., SiN materials. The gate structures 14 further include a high-k gate dielectric material 14b on the sidewall spacers 14a and bottom of trenches (formed by removal of dummy gate structures). In embodiments, the high-k dielectric gate material 14b can be hafnium based dielectrics, as an example. In further embodiments, examples of such high-k dielectrics include, but are not limited: $Al_2O_3$, $Ta_2O_3$, $TiO_2$, $La_2O_3$, $SrTiO_3$, $LaAlO_3$, $ZrO_2$, $Y_2O_3$, $Gd_2O_3$, and combinations including multilayers thereof.

A gate material 14c, e.g., doped polysilicon, is deposited over the high-k dielectric gate material 14b. In addition, the gate structures 14 can be capped with a sacrificial capping material 14d. In embodiments, the sacrificial capping material 14d can be SiN material, which is deposited to protect the underlying gate material 14c during subsequent source/drain contact fabrication processes. Source/drain regions 16 are formed on sides of the gate structures 14. In embodiments, the source/drain regions 16 can be raised epitaxial material, e.g., semiconductor material such as Si or SiGe, doped with impurities.

The source/drain regions 16 can undergo a silicide process for contact formation. As should be understood by those of skill in the art, the silicide process begins with deposition of a thin transition metal layer, e.g., nickel, cobalt or titanium, over fully formed and patterned semiconductor devices (e.g., doped or ion implanted source and drain regions 16). After deposition of the material, the structure is heated allowing the transition metal to react with exposed silicon (or other semiconductor material as described herein) in the active regions of the semiconductor device (e.g., source, drain, gate contact region) forming a low-resistance transition metal silicide. Following the reaction, any remaining transition metal is removed by chemical etching, leaving silicide contacts in the active regions of the device. It should be understood by those of skill in the art that silicide contacts will not be required on the devices, when a gate structure is composed of a metal material.

FIG. 1 further shows a liner 18 formed over the gate structures 14 and the source/drain regions 16. In embodiments, the liner 18 is a TiN liner which can be deposited by a Plasma Enhanced Vapor Deposition (PEVD) process. The liner 18 will be deposited over the sidewall spacers 14a, the sacrificial capping material 14d and the source and drain regions 16. The remaining spaces between the plurality of gate structures 14 can be filled with metal contact material 22. For example, the metal contact material 22 can be Cobalt (Co), deposited by a conventional deposition process, e.g., chemical vapor deposition (CVD) processes. In embodiments, as shown in FIG. 1, the deposition process will result in overburden 22' of the metal contact material 22, e.g., metal material above the gate structures 14.

An isolation region (interlevel dielectric material) 20 is formed between two adjacent gate structures 14' (extending into the overburden 22' above the gate structures 14). In embodiments, the adjacent gate structures 14' can be dummy gate structures. The isolation region 20 may include, e.g., a shallow trench isolation region 20a formed prior to the replacement gate structures 14, 14'. The isolation region 20 can be composed of oxide material with a liner 20b composed of SiN, for example.

In embodiments, the isolation region 20 can be formed by conventional lithography, etching and deposition methods known to those of skill in the art. For example, a resist formed over the metal contact material 22 is exposed to energy (light) to form a pattern (opening). An etching process with a selective chemistry, e.g., reactive ion etching (RIE), will be used to form one or more trenches in the metal contact material 22 through the openings of the resist. The resist can then be removed by a conventional oxygen ashing process or other known stripants. Following the resist removal, the liner 20b and insulator material can be deposited by any conventional deposition processes, e.g., chemical vapor deposition (CVD) processes. Any residual material on the surface of the metal contact material 22 can be removed by conventional chemical mechanical polishing (CMP) processes.

Figure 2:
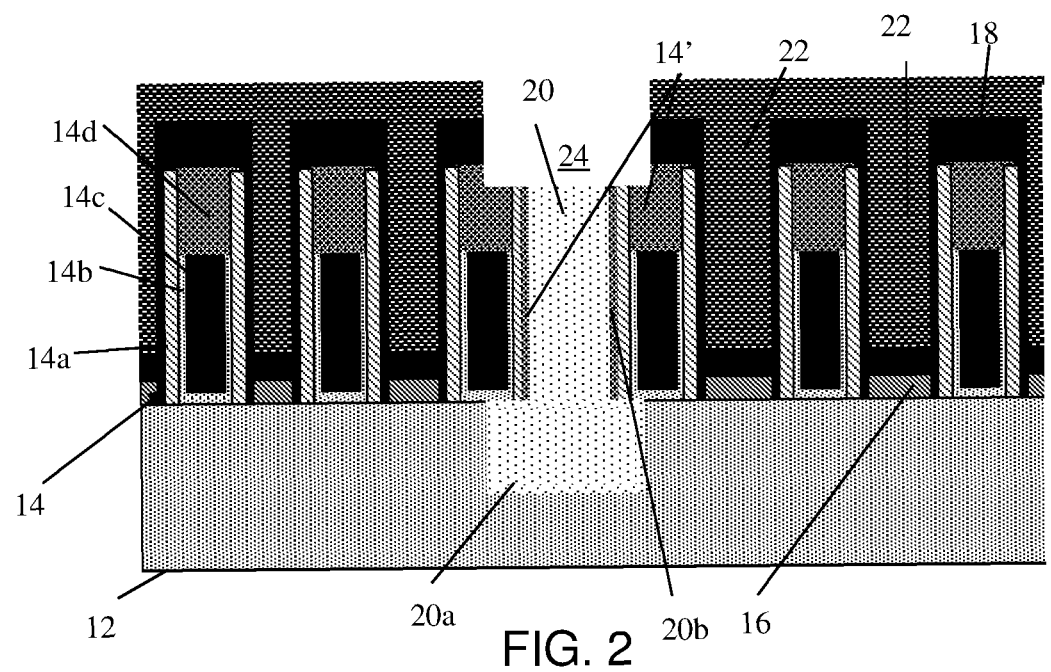
FIG. 2 shows a recess between gate structures, amongst other features, and respective fabrication processes in accordance with aspects of the present disclosure.

In FIG. 2, portions of the isolation region 20 are removed (recessed) by a selective etching process. More specifically, the selective etching process can be a low or zero bias $CF_4$, $CHF_3$, $CH_2F_2$, $CH_3F$ plasma or plasma with mixture of the gases, which selectively etches or recesses the material of the isolation region 20, e.g., $SiO_2$ and SiN material, to form a recess 24. In embodiments, the etching process will also remove portions of the sacrificial capping material 14d, which contributes to the recess 24. In embodiments, the recess 24 is below the surface of the sacrificial capping material 14d, e.g., approximately in the range of 5 nm to about 30 nm. It should be noted, though, that the selective etching process will not expose any of the underlying gate material 14c.

Figure 3:
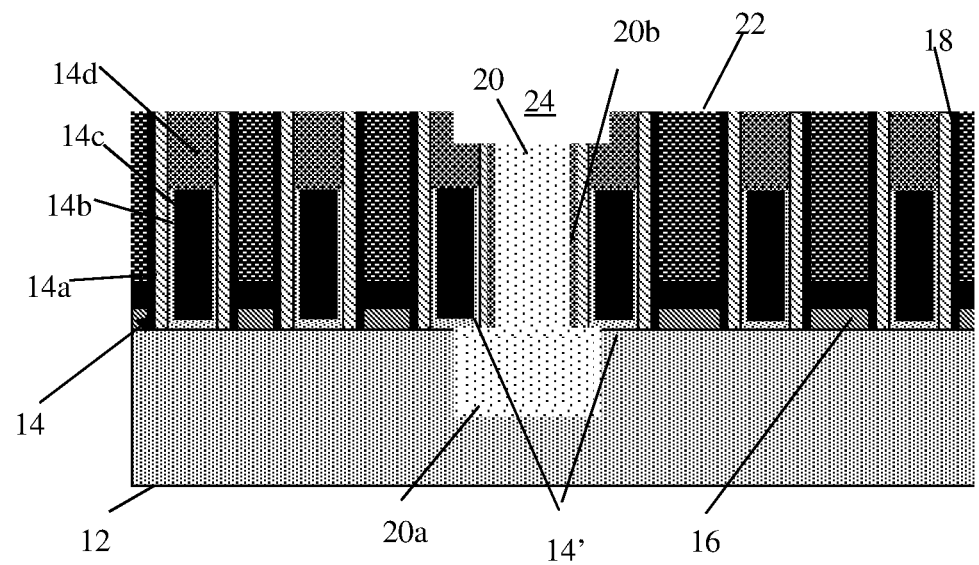
FIG. 3 shows planarized gate structures and contact material, amongst other features, and respective fabrication processes in accordance with aspects of the present disclosure.

As further shown in FIG. 3, the metal contact material 22 and the liner 18 undergo a polishing process, stopping on the sacrificial capping material 14d. In more specific embodiments, the metal contact material 22 and the liner 18 undergo a selective CMP process, which will not erode the sacrificial capping material 14d. In this way, the sacrificial capping material 14d will remain over the gate material 14c, preventing it from being exposed and causing shorting in subsequent source/drain contract fabrication processes.

Figure 4:
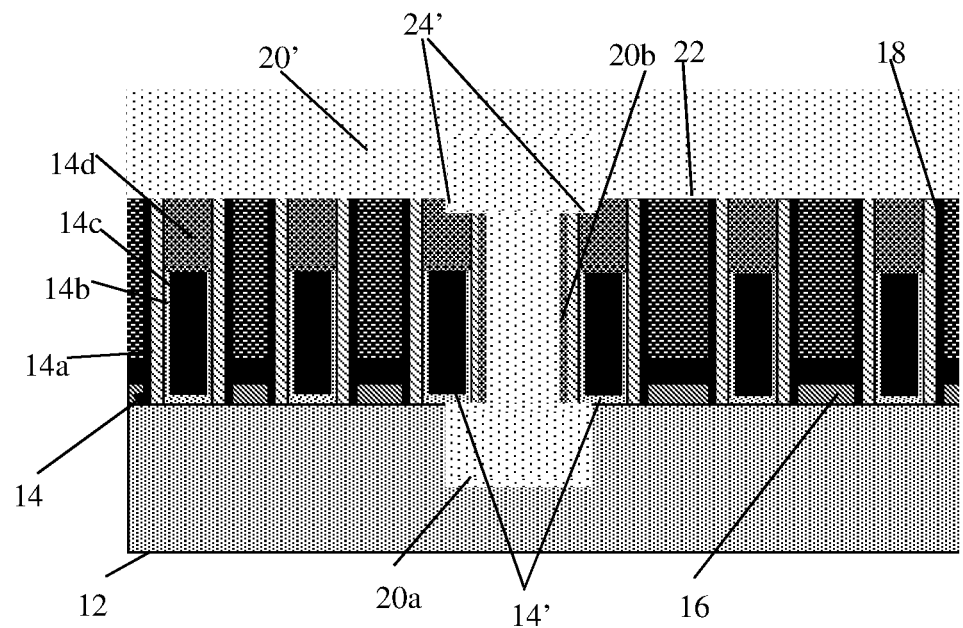
FIG. 4 shows an interlevel dielectric material over the gate structures, amongst other features, and respective fabrication processes in accordance with aspects of the present disclosure.

In FIG. 4, an interlevel dielectric layer 20' is deposited over the sacrificial capping material 14d and within remaining portions of the recess 24. In embodiments, the interlevel dielectric layer 20' is an oxide material, e.g., $SiO_2$, deposited by a conventional deposition method. For example, the interlevel dielectric layer 20' can be deposited by a CVD process. As shown in FIG. 4, the interlevel dielectric layer 20' within the recess forms a stepped feature 24' with the adjacent gate structures 14'.

Figure 5:
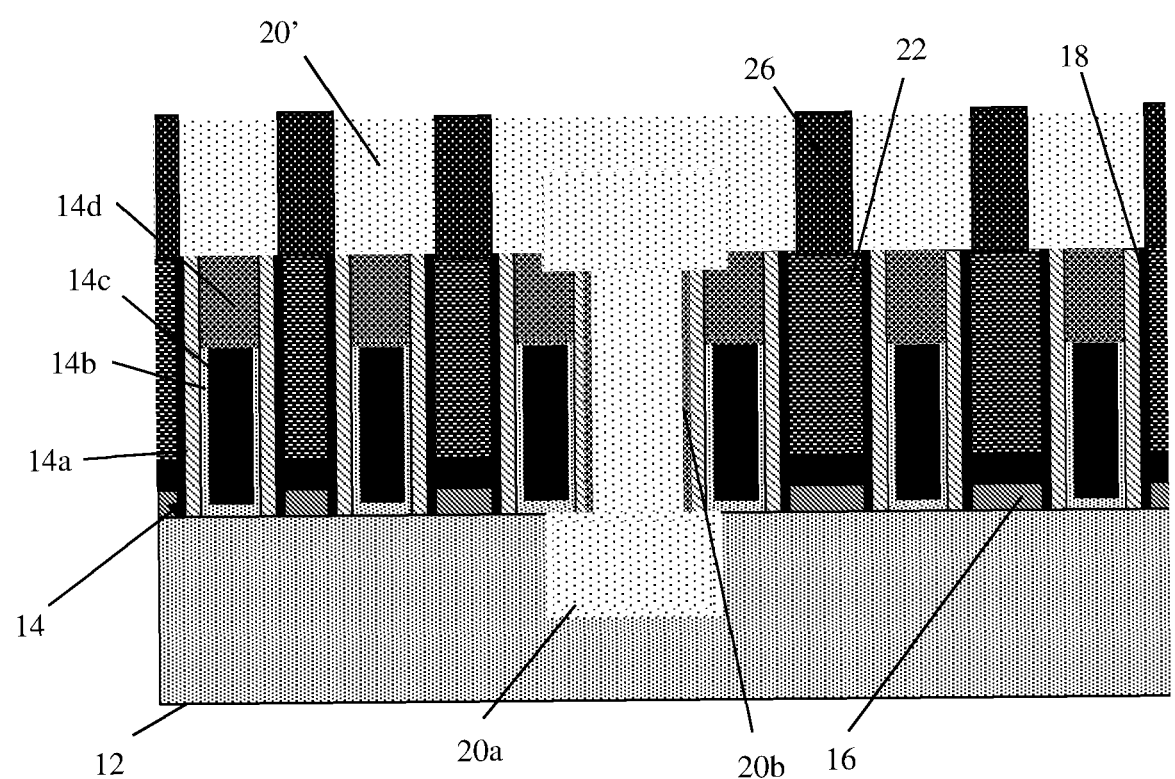
FIG. 5 shows source and drain contacts, amongst other features, and respective fabrication processes in accordance with aspects of the present disclosure.

FIG. 5 shows source and drain contacts 26 in the interlevel dielectric layer 20', extending to and contacting with the metal contact material 22, e.g., Co. In embodiments, the source and drain contacts 26 can be any appropriate material including, e.g., tungsten or aluminum, lined with TiN, Ta, TaN, etc. The source and drain contacts 26 can be formed by conventional lithography, etching, deposition and planarization processes. For example, a resist formed over the interlevel dielectric layer 20' is exposed to energy (light) to form a pattern (opening), aligned with and exposing the metal contact material 22 over the source/drain regions 16. An etching process with a selective chemistry, e.g., RIE, will be used to form one or more trenches in the interlevel dielectric layer 20' through the openings of the resist. The resist can then be removed by a conventional oxygen ashing process or other known stripants. Following the resist removal, the conductive material can be deposited by any conventional deposition processes, e.g., CVD processes. Any residual material on the surface of the interlevel dielectric layer 20' can be removed by conventional chemical mechanical polishing (CMP) processes.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
    a plurality of gate structures each of which include a capping material;
    source and drain regions adjacent to the plurality of gate structures;
    cobalt contacts between the plurality of gate structures and extending to and in electrical contact with the source and drain regions;
    an isolation material between adjacent gate structures of the plurality of gate structures;
    a stepped feature in the capping material of the adjacent gate structures;
    dielectric material in the stepped feature and above the capping material of the plurality of gate structures; and
    source and drain contacts in the dielectric material and contacting the cobalt contacts.

2. The structure of claim 1, wherein the isolation material is composed of oxide material with a liner on sidewalls of the adjacent gate structures.

3. The structure of claim 2, wherein the line is SiN.

4. The structure of claim 2, wherein the liner lines the capping material.

5. The structure of claim 4, wherein the stepped feature is a partial recess of the capping material.

6. The structure of claim 5, wherein the isolation material between adjacent gate structures of the plurality of gate structures extends into an underlying substrate.

7. The structure of claim 6, wherein the isolation material extending into the underlying substrate is a shallow trench isolation region.

8. The structure of claim 7, wherein the source and drain regions are above the substrate.

9. The structure of claim 8, wherein the source and drain regions are epitaxial growths.

10. The structure of claim 8, wherein the cobalt contacts and a non-recessed portion of the capping material are planar.

11. The structure of claim 9, wherein the capping material is a nitride material.

12. The structure of claim 1, wherein the plurality of gate structures each sidewall spacers, a high-k gate dielectric material on the sidewall spacers, gate material over the high-k dielectric gate material and the capping material directly on the gate material.

13. The structure of claim 12, further comprising a liner over sidewall spacers and the source and drain regions.

14. A structure comprising:
    a plurality of gate structures on a substrate;
    source and drain regions adjacent to the plurality of gate structures;
    contacts between the plurality of gate structures and extending to and in electrical contact with the source and drain regions;
    capping material on the plurality of gate structures, with the capping material on adjacent gate structures of the plurality of gate structure comprising a stepped portion;
    isolation material between the adjacent gate structures and within the stepped portion, and which also extends to within the substrate between the adjacent gate structures to form a shallow trench isolation structure; and
    source and drain contacts contacting the contacts between the plurality of gate structures.

* * * * *